(12) United States Patent  (10) Patent No.: US 7,788,615 B2
Baumgartner et al.  (45) Date of Patent: *Aug. 31, 2010

(54) COMPUTER PROGRAM PRODUCT FOR VERIFICATION USING REACHABILITY OVERAPPROXIMATION

(75) Inventors: Jason Raymond Baumgartner, Austin, TX (US); Hari Mony, Austin, TX (US); Viresh Paruthi, Austin, TX (US); Jiazhao Xu, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 463 days.

This patent is subject to a terminal disclaimer.

(21) Appl. No.: 11/938,612

(22) Filed: Nov. 12, 2007

(65) Prior Publication Data

US 2008/0052650 A1   Feb. 28, 2008

Related U.S. Application Data

(63) Continuation of application No. 11/011,245, filed on Dec. 14, 2004, now Pat. No. 7,322,017.

(51) Int. Cl.
    G06F 17/50    (2006.01)
    G06F 9/45     (2006.01)
(52) U.S. Cl. .................. 716/5; 716/4; 716/18; 703/13; 703/14
(58) Field of Classification Search ................ 716/4–5, 716/18; 703/13–14
See application file for complete search history.

(56) References Cited

U.S. PATENT DOCUMENTS

| 6,026,220 A | 2/2000 | Cleereman et al. |
| 6,141,633 A | 10/2000 | Iwashita et al. |
| 6,192,505 B1 | 2/2001 | Beer et al. |
| 6,425,110 B1 | 7/2002 | Hathaway et al. |
| 6,557,145 B2 | 4/2003 | Boyle et al. |
| 6,651,234 B2 | 11/2003 | Gupta et al. |
| 6,848,088 B1 | 1/2005 | Levitt et al. |

(Continued)

OTHER PUBLICATIONS

Office Action mailed on Mar. 21, 2007 for U.S. Appl. No. 11/011,245.
Notice of Allowance with Examiner's Amendment mailed on Sep. 7, 2007 for U.S. Appl. No. 11/011,245.
Office Action mailed on Nov. 7, 2007 for U.S. Appl. No. 11/011,245.
Office Action mailed on Apr. 30, 2008 for U.S. Appl. No. 11/938,656.

*Primary Examiner*—Jack Chiang
*Assistant Examiner*—Nghia M Doan
(74) *Attorney, Agent, or Firm*—Dillon & Yudell LLP

(57) ABSTRACT

A method, system and computer program product for verifying that a design conforms to a desired property is disclosed. The method comprises receiving a design, a first initial state of the design, and a property for verification with respect to the design. The first initial state of the design is expanded to create a superset of the first initial state containing one or more states reachable from the first initial state of the design. A superset is synthesized to define a second initial state of the design. Application of the superset to the design is overapproximated through cutpoint insertion into the superset to obtain a modified superset, and the property is verified with reference to the modified superset.

6 Claims, 2 Drawing Sheets

U.S. PATENT DOCUMENTS

| | | |
|---|---|---|
| 6,944,838 B2 | 9/2005 | Mcmillan |
| 7,047,139 B2 | 5/2006 | Shtrichman |
| 7,111,268 B1 | 9/2006 | Anderson et al. |
| 7,322,017 B2 | 1/2008 | Baumgartner et al. |
| 7,360,186 B2 * | 4/2008 | Sidle et al. .................. 716/5 |
| 7,475,370 B2 | 1/2009 | Baumgartner et al. |
| 2003/0208730 A1 | 11/2003 | Singhal et al. |
| 2006/0129959 A1 | 6/2006 | Mang et al. |

* cited by examiner

COMPUTER PROGRAM PRODUCT FOR VERIFICATION USING REACHABILITY OVERAPPROXIMATION

PRIORITY CLAIM

The present application is a continuation of U.S. patent application Ser. No. 11/011,245, filed on Dec. 14, 2004 now U.S. Pat. No. 7,322,017, and entitled, "Method for Verification Using Reachability Overapproximation," which is incorporated herein by reference.

CROSS-REFERENCE TO RELATED APPLICATIONS

The present application is related to the following copending U.S. patent application filed on even date herewith, and incorporated herein by reference in their entirety:
Ser. No. 11/011,246, entitled "Method for Incremental Design Reduction Via Iterative Overapproximation and Re-Encoding Strategies"

BACKGROUND OF THE INVENTION

1. Technical Field

The present invention relates in general to testing and verification, and in particular to verification of digital designs. Still more particularly, the present invention relates to a system, method and computer program product for verification of digital designs, which includes verifying conformance of a design to a desired property.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error-free designs, the processor and ASIC design and development community has developed rigorous, if incredibly expensive, methods for testing and verification. Functional hardware verification has been a traditional method for verifying such complex designs as processor chips. Because the functional hardware verification time for a design grows in relation to the number of logic elements, functional hardware verification of complex systems is one of the most time-consuming computing tasks today. It is therefore important to use functional hardware verification cycles effectively, with the aim that few bugs escape and development time is reduced.

As mentioned above, functional hardware verification is a computationally expensive process; for sequential designs, functional hardware verification is a PSPACE-complete problem (by algorithmic complexity analysis) and hence generally requires resources which are exponential with respect to the size of the design under verification. Many prior art function hardware verification proof algorithms rely upon reachability analysis, which requires enumerating the reachable states of the design under test to assess whether the design conforms to its specification, which unfortunately is a size-limited process.

Reachability analysis is a powerful verification framework; it is able to identify whether a design satisfies its specification (i.e., if all reachable states of a design satisfy the property being verified, then a correctness proof has been completed) and also whether the design does not satisfy its specification (if any of the reachable states does not satisfy the property being verified). Reachability algorithms operate by assigning $R\_0$ to be the set of predefined initial states of the design under verification, then assign $R\_\{i+1\}$ (for increasing i) to be the set of all states which may be reached in one design transition from $R\_i$. Eventually, $R\_\{i+1\}$ will be a subset of all the previous states encountered in $R\_0 \ldots R\_i$, after which this process will terminate; this final set of reachable states is referred to as R. To partially alleviate some of the computational overhead of the expensive process of computing the exact set of reachable states, there have been numerous proposals to "overapproximate" the set of reachable states. For example, some authors have proposed using "inductive" methods. The drawback of prior art overapproximation methods is that they are often inconclusive, resulting in "spurious failures" due to their overapproximate nature.

Despite decades of research in improving the performance of reachability analysis, such techniques are still limited in application to designs with several hundreds of state elements or less and are also hindered by other design size metrics. Because of the size limitations of reachability analysis, there has been some research in ways to overapproximate the reachable state set to enable computational shortcuts. For example, inductive proofs begin with $R\_0$ being all states which do not themselves violate a property (after guaranteeing that the actual initial states of the design are a subset of this overapproximated $R\_0$), and compute an overapproximated set R' starting from this overapproximated initial state set. The benefits of this approach include a substantial decrease in the number of steps needed to complete the analysis. The main drawback of this inductive approach is that it often renders an inconclusive result. In particular, if the overapproximated set R' contains some states S' which violate the property being verified, one cannot immediately discern if this violation is only due to the overapproximation of the initial state set (i.e., S' is a subset of R'-R), or if S' contains some truly reachable states in R. The former case is a spurious failure of the property being verified. What is needed is a more efficient method for verifying digital designs utilizing a functional hardware verification model, and more particularly, for verifying digital designs utilizing an enhanced overapproximation method.

SUMMARY OF THE INVENTION

A method, system and computer program product for verifying that a design conforms to a desired property is disclosed. The method comprises receiving a design, a first initial state or set of initial states of the design, and a property for verification with respect to the design. The first initial state or set of initial states of the design is expanded to create a superset of the first initial state or set of initial states containing all states reachable from the first initial state or set of initial states of the design. The superset is synthesized to define a second initial state of the design. Application of the superset to the design is overapproximated through cutpoint insertion into the superset to obtain a modified superset, and the property is verified with reference to the modified superset.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

The present invention alleviates the problems of exponential complexity and associated resource consumption in functional hardware verification cycles by providing a method, system and computer program product that verify that a design conforms to a desired property by efficiently using overapproximation. The present invention manages available resources more efficiently than conventional techniques by safely overapproximating the reachable state set of the design under verification. The present invention allows for a higher degree of scalability of proof algorithms, while avoiding the spurious failure problem often arising with prior art overapproximation techniques. The present invention also reduces the size of the design under verification (which speeds up all forms of analysis), and enhances reachability analysis through a simplified initial state representation and a smaller number of image computations necessary to enumerate all reachable states through the overapproximation.

Figure 1:
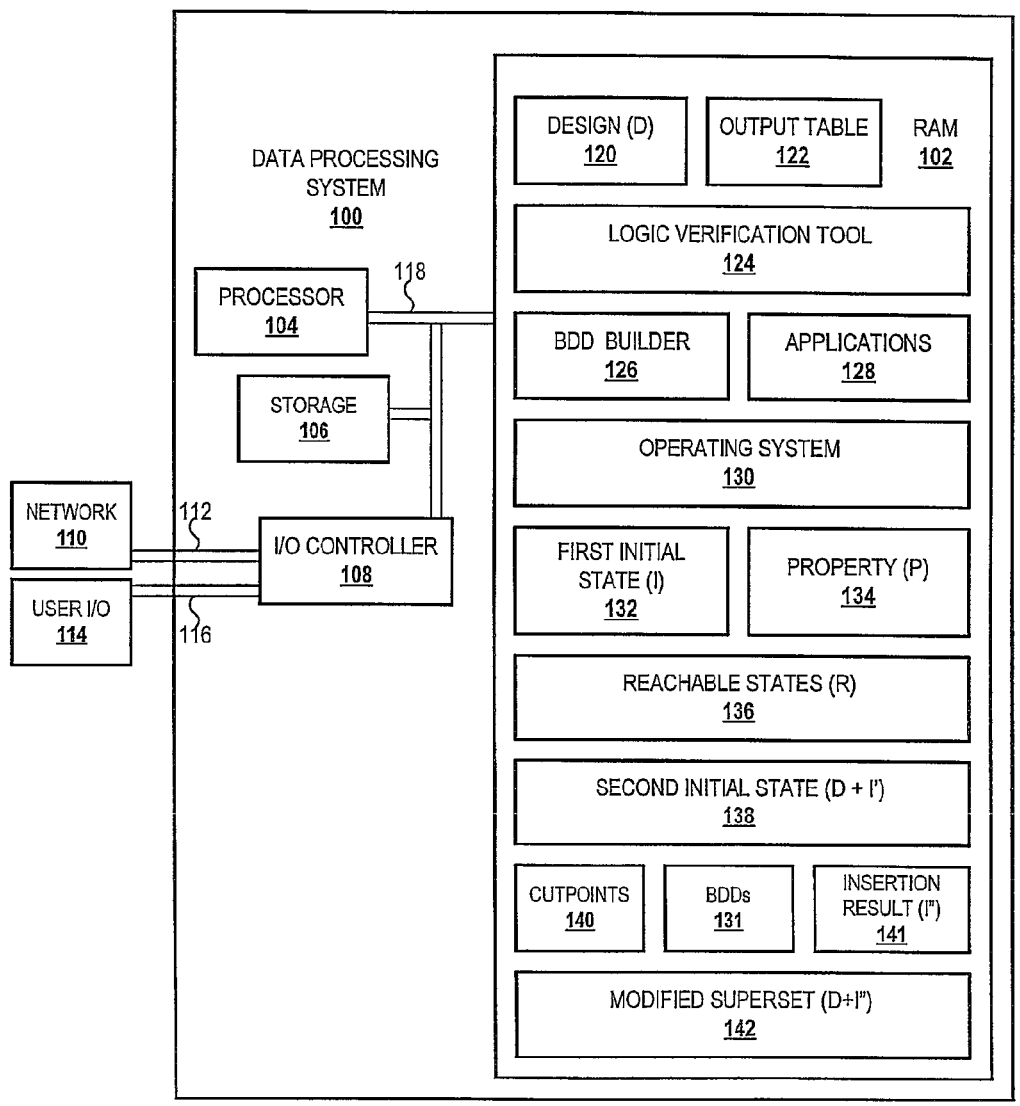
FIG. 1 depicts a block diagram of a data processing system equipped with a computer program product for verifying that a design conforms to a desired property by efficiently using overapproximation, in accordance with a preferred embodiment of the present invention.

With reference now to the figures, and in particular with reference to FIG. 1, a block diagram of a data processing system equipped with a computer program product for verifying that a design conforms to a desired property by efficiently using overapproximation, in accordance with a preferred embodiment of the present invention, is depicted. A data processing system 100 contains a processing storage unit (e.g., RAM 102) and a processor 104. Data processing system 100 also includes non-volatile storage 106 such as a hard disk drive or other direct access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions, while operating in accordance with a preferred embodiment of the present invention. These items include a design (D) 120 and an output table 122 for interaction with a logic verification tool 124, and a binary decision diagram (BDD) builder 126. Other applications 128 and logic verification tool 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention.

Processor 104 executes instructions from programs, often stored in RAM 102, in the course of performing the present invention. In a preferred embodiment of the present invention, processor 104 executes logic verification tool 124. Logic verification tool 124 efficiently verifies that design (D) 120 conforms to a desired property using overapproximation in conjunction with the operation of binary decision diagram builder 126 on the circuit specifications contained in design (D) 120. Generally speaking, logic verification tool 124 contains rule-based instructions for predicting the behavior of logically modeled items of hardware. Logic verification tool 124 uses the series of rules contained in its own instructions, in conjunction with design (D) 120, and associated binary decision diagrams (BDDs) 131 from binary decision diagram builder 126, which converts the structural representation in design (D) 120 into a functionally canonical form in BDDs 131.

Design (D) 120 may model the designs of many different kinds of logical hardware, such as microprocessors and application specific integrated circuits (ASICs). Design (D) 120 is represented structurally as a netlist, comprising a directed graph where each node is a gate of some type, e.g. an AND gate, an inverter, a primary input (or random gate), or a state element. BDD builder 126 transforms design (D) 120 into BDDs 131 for use with logic verification tool 124. The netlist of Design (D) 120 is defined in terms of semantic traces, which map the gates to 0,1 values in BDDs 131 over time. Each state element in design (D) 120 is associated with a next-state function (defining what value it will take one timestep in the future), as well as an initial value (defining what value it will take at time 0), each of which are represented as a gate.

Logic verification tool 124 records results to output table 122. Logic verification tool 124 may also report the contents of output table 122 or selected indicators of the status of design (D) 120 to user I/O 114 or applications 128. Additionally, all or part of logic verification tool 124, operating system 130, design (D) 120, and output table 122 may, at times, be stored in storage 106.

Additional items of data stored in RAM 102 include first initial state (I) 132, property (P) 134, reachable states (R) 136, second initial state (I') 138, cutpoints 140, insertion result (I") 141, and modified superset (D+I") 142. First initial state (I) 132 contains a specification of the initial state or set of initial states of design (D) 120 for verification. Property (P) 134 contains the behavior to be verified on design (D) 120. Reachable states (R) 136 contains the set of states that can be achieved in design (D) 120. Second initial state (I') 138 contains a new set of initial states for design (D) 120 as calculated on the basis of reachable states (R) 136. Cutpoints 140 contains a group of random gate insertion instructions for insertion into second initial state (I') 138 to create insertion result (I") 141, and modified superset (D+I") 142 contains the overapproximated application insertion result (I") 141 to design (D) 120.

The method of the present invention involves a novel approach for "safely" overapproximating first initial state (I) 132 in a way which will not render a spurious failure. The method of the present invention broadly includes logic verification tool 124 performing structural symbolic simulation to inject into design (D) 120 a set of initial states in first initial state (I) 132 which underapproximates design (D) 120 reachable state set in reachable states (R) 136, then applying an insertion of cutpoints 140 to overapproximate those initial states as overapproximated application insertion result (I") 141. Logic verification tool 124 utilizes a semantic analysis approach similar to "localization" to inject these cutpoints 140 so as to eliminate from analysis as much of the initial state logic as possible (hence yielding as large of an overapproximation as possible in overapproximated application insertion result (I") 141), while striving to ensure that the resulting overapproximation in overapproximated application insertion result (I") 141 will not cause a spurious failure, which is a frequent flaw in prior-art overapproximate techniques such as induction.

Figure 2:
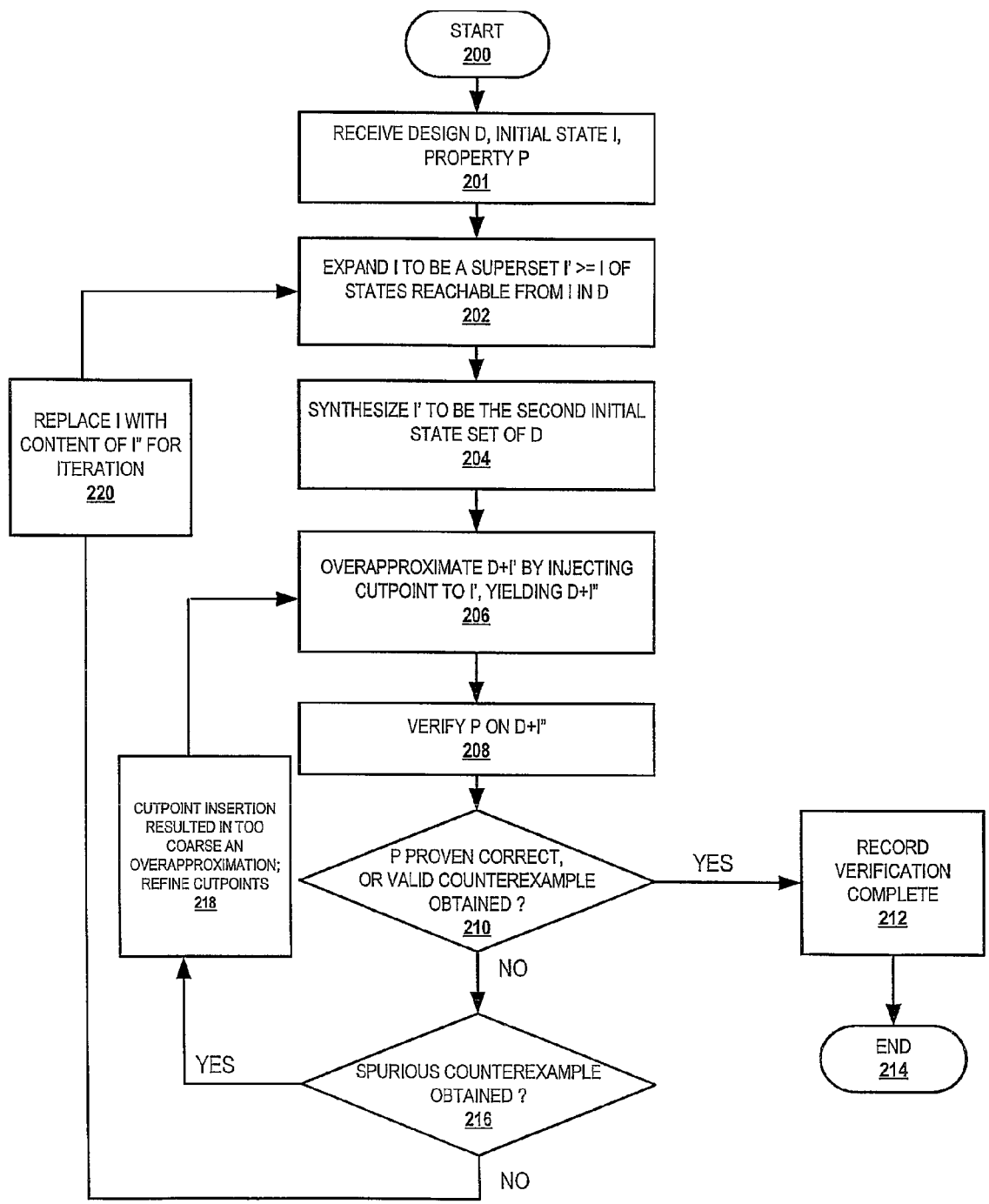
FIG. 2 is a high-level logical flowchart of a process for verifying that a design conforms to a desired property efficiently using overapproximation, in accordance with a preferred embodiment of the present invention.

Turning now to FIG. 2, a high-level logical flowchart is given, which illustrates a process for efficiently verifying that a design conforms to a desired property using overapproximation, in accordance with a preferred embodiment of the present invention. The process begins at step 200. The process next moves to step 201, which depicts logic verification tool 124 receiving design (D) 120, first initial state (I) 132 and property (P) 134. The process then proceeds to step 202. At step 202, logic verification tool 124 expands the set of initial states in first initial state (X) 132 by performing any form of underapproximate state space traversal from the first initial state (I) 132 to obtain a set of states S. It is only necessary that S is a superset (including additional states, or exactly the same set of states) of the specified first initial state (I) 132, and that S is a subset of reachable states (R) 136. Example algorithms for this include binary decision diagram-based or structural symbolic simulation, partial or complete reachability analysis, and 'retiming' (where the retimed initial values are calculated by symbolic simulation). Note that the specified set of first initial state (I) 132 may itself comprise multiple states, which will allow some embodiments to reduce or omit step 202.

Note also that the analysis performed in step 202 is often used in other portions of the overall verification flow; this step may require virtually no dedicated effort, and often entails the practice of merely reusing verification work that has already been performed. For example, in a multiple-engine based logic verification tool 124, the work of step 202 may be a byproduct of the effort expended by 'previously run' engines.

The process then moves to step 204, which illustrates logic verification tool 124 synthesizing reachable states (R) 136 into second initial state (I') 138 of design (D) 120. Second initial state (I') 138 is a superset of first initial state (I) 132 and a subset of reachable states (R) 136. If initial state (I) 132 was enlarged in step 202, step 208 may include creating a modified netlist by synthesizing the enlarged second initial state (I') 138 into a netlist and updating the initial value mappings of the state elements of the netlist to reflect this updated set. If second initial state (I') 138 was obtained via structural symbolic simulation, then one skilled in the art will realize that this mapping is trivial and requires only updating the initial value mappings of the state elements to the gates obtained during the structural symbolic simulation. Otherwise, logic verification tool 124 may synthesize second initial state (I') 138 using existing techniques (e.g., if the state set is represented by BDDs 131, logic verification tool 124 may synthesize it as a netlist using a straight-forward multiplexor representation over parametric random variables to "enable" the various paths through the BDD nodes, and then update initial value mappings to the appropriate synthesized gates). Again, in a multiple-engine based logic verification tool 124, this encoding is often a byproduct of the effort expended by 'previously run' engines.

Next, the process proceeds to step 206. At step 206, logic verification tool 124 overapproximates the combination of design (D) 120 with second initial state (I') 138 to create modified superset (D+I") 142 by injecting cutpoints 140 into second initial state (I') 138 to generate insertion result (I") 141 and by combining design (D) 120 with insertion result (I") 141. Cut-point insertion refers to the process of replacing a gate in the netlist with a random gate. A design modified by cut-point insertion is called overapproximated because it may "simulate" the original design—the random gate may exhibit any behavior that the gate it is replacing may exhibit, but the converse is not necessarily true. The process then moves to step 208, which depicts logic verification tool 124 verifying property (P) 134 on modified superset (D+I") 142.

The process next proceeds to step 210. At step 210, logic verification tool 124 determines whether either property (P) 134 on design (D) 120 has been proven correct or a valid counterexample of property (P) 134 on design (D) 120 has been obtained through the attempt to verify property (P) 134 on design (D) 120 in step 208. If property (P) 134 on design (D) 120 has been proven correct or a valid counterexample of property (P) 134 on design (D) 120 has been obtained through the attempt to verify property (P) 134 on design (D) 120 in step 208, then the process moves to step 212. At step 212, logic verification tool 124 records the result of step 208 to output table 122, indicating that verification is complete with respect to property (P) 134 on design (D) 120. The process then ends at step 214.

If, at step 210, property (P) 134 on design (D) 120 has not been proven correct and a valid counterexample of property (P) 134 on design (D) 120 has not been obtained through the attempt to verify property (P) 134 on design (D) 120 in step 208, then the process moves to step 216. Step 216 illustrates logic verification tool 124 determining whether a spurious counterexample of property (P) 134 on design (D) 120 has been obtained through the attempt to verify property (P) 134 on design (D) 120 in step 208. If logic verification tool 124 determines that a spurious counterexample of property (P) 134 on design (D) 120 has not been obtained through the attempt to verify property (P) 134 on design (D) 120 in step 208, then the process next moves to step 220, which depicts logic verification tool 124 replacing the content of first initial state (I) 132 with the content of insertion result (I''') 141, in preparation for an iterative repetition of the process of steps 202-210. The process then returns to step 202, which is described above.

If logic verification tool 124 determines that a spurious counterexample of property (P) 134 on design (D) 120 has been obtained through the attempt to verify property (P) 134 on design (D) 120 in step 208, then the process next proceeds to step 218, which illustrates logic verification tool 124 refining cutpoints 140 in response to the cutpoint insertion in step 206 having yielded too coarse an overapproximation. The process then returns to step 206, which is described above.

In one embodiment, logic verification tool 124 may use a "localization refinement" scheme to prevent spurious failures. Logic verification tool 124 will first grossly overapproximate the set of initial states by inserting cutpoints 140 at every gate mapped to as an initial state of a state variable in initial state (I) 132. Logic verification tool 124 then performs low-cost underapproximate analysis (such as random simulation, or SAT or BDD-based symbolic simulation) to discover whether any spurious failures can occur. Note that underapproximate algorithms are in a lower complexity class than reachability analysis (i.e., NP-complete vs. PSPACE-complete). If spurious failures exist, logic verification tool 124 analyzes the cause of those spurious failures (e.g., the semantic traces correlating to the failures), and attempts to refine the earlier overapproximation by removing the corresponding causal cutpoints 140 and instead injecting cutpoints 140 to gates in the fan-in of the earlier cutpoints 140. This process may be repeated as many times as deemed necessary to eliminate all suspected "false failures". Thereafter, a proof algorithm, such as reachability analysis, may be applied to the "safely" overapproximated design, with spurious failures removed.

As stated, the method of the preferred embodiment transforms the design (D) 120 into a simplified form by overapproximating its initial state representation. Logic verification tool 124 may then use the simplified design to import to another process, e.g. to import to an application 128, which will attempt to solve the resulting problem. Additionally, one may apply the method of the preferred embodiment in an iterative process to yield incremental simplifications. In a multiple-engine based logic verification tool 124 toolset, logic verification tool 124 additionally may apply any variety of additional transformations to the resulting simplified problem.

The benefits of the present invention are several-fold. First, cut-point insertion reduces the number of gates in the cone of influence of the property being verified, thus enhancing all subsequent analysis. Second, because the particular cutpoint insertion scheme of the preferred embodiment overapproximates the initial state set, the depth of reachability analysis algorithms tends to decrease, in turn decreasing overall use of resources. Additionally, the particular form of overapproximation in the preferred embodiment may often enhance BDD-based analysis by making BDDs more symmetric, more compact and easier to manipulate. This last advantage illustrates that BDD-based approaches may obtain particularly pronounced benefits from this invention. Third, the method of overapproximation of the preferred embodiment relies solely upon overapproximating the initial state (I) 132 of the netlist of design (D) 120.

As mentioned above, the present invention manages available resources more efficiently than conventional methods by safely overapproximating the reachable state set of the design under verification. The present invention promotes a higher degree of scalability of proof algorithms, while avoiding the spurious failure problem often arising with prior art overapproximate methods. The present invention reduces the size of the design under verification (which speeds up all forms of analysis), and enhances reachability analysis through a simplified initial state representation and a smaller number of image computations necessary to enumerate all reachable states through the overapproximation.

While an invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A computer program product in a computer-readable storage device which is executed by a computer system for verifying that a design conforms to a desired property, said computer program product comprising:
    a computer-readable storage device;
    instructions on the computer-readable storage device for receiving a circuit design, a first initial state of said circuit design, and a property for verification with respect to said circuit design, wherein said first initial state is represented as a binary decision diagram that includes a plurality of nodes, and wherein said first initial state is further associated with an initial value that defines a value said first initial state takes at time 0;
    instructions on the computer-readable storage device for expanding said first initial state of said circuit design to create a superset of said first initial state containing one or more states reachable from said first initial state of said circuit design;
    instructions on the computer-readable storage device for synthesizing said superset to define a second initial state of said circuit design, wherein said second initial state is synthesized as a netlist by utilizing multiplexor representation over parametric variables to enable various paths through said plurality of nodes in said binary decision diagram and updating initial value mappings to appropriate synthesized gates represented in said netlist;
    instructions on the computer-readable storage device for overapproximating application of said superset and said second initial state to said circuit design through cut-point insertion into said superset to obtain a modified superset, wherein said cut-point insertion replaces a gate in said netlist with a random gate; and
    instructions on the computer-readable storage device for verifying said property by comparing said property to said modified superset.

2. The computer program product of claim 1, wherein said instructions for receiving a design further comprise instructions for receiving a structural representation of said design.

3. The computer program product of claim 1, further comprising instructions for determining that a counterexample has been obtained.

4. The computer program product of claim 3, further comprising instructions for determining that said counterexample is valid.

5. The computer program product of claim 3, further comprising instructions for determining that said counterexample is spurious.

6. The computer program product of claim 5, further comprising instructions for revising cutpoints of said cutpoint insertion to generate a revised cutpoint set.

* * * * *